United States Patent [19]

Nishikitani et al.

[11] Patent Number: 5,231,329
[45] Date of Patent: Jul. 27, 1993

[54] ORGANIC THIN FILM ELECTROLUMINESCENT DEVICE

[75] Inventors: Yoshinori Nishikitani, Yokohama; Naoki Kataoka, Kawasaki; Nobuyuki Kuroda; Kazuo Matsuura, both of Yokohama, all of Japan

[73] Assignee: Nippon Oil Co., Ltd., Tokyo, Japan

[21] Appl. No.: 728,646

[22] Filed: Jul. 11, 1991

[30] Foreign Application Priority Data

Jul. 16, 1990 [JP] Japan .................. 2-185400

[51] Int. Cl.$^5$ ............................. H01J 1/62
[52] U.S. Cl. ............................ 313/503; 313/504; 313/506; 313/463; 428/690; 428/691; 428/917
[58] Field of Search ............ 313/501, 503, 504, 506, 313/463; 428/690, 691, 917, 918, 930, 931

[56] References Cited

U.S. PATENT DOCUMENTS 4,539,507 9/1985 Vanslyke et al. ............. 313/504
4,769,292 9/1988 Tang et al. .................. 313/504 X

OTHER PUBLICATIONS

Adachi et al., *Jap. J. of Appl. Phys.*, 27:L269–L271, Feb. 1988.
Tang et al., *Appl. Phys. Lett.*, 51:913–915, Jul. 1987.

*Primary Examiner*—Donald J. Yusko
*Assistant Examiner*—Ashok Patel
*Attorney, Agent, or Firm*—Darby & Darby

[57] ABSTRACT

An organic thin film electroluminescent device is composed of an electron transport layer, a hole transport layer and a transparent electrode. The electron transport layer is constituted of an electron conducting polymer represented by the formula (I)

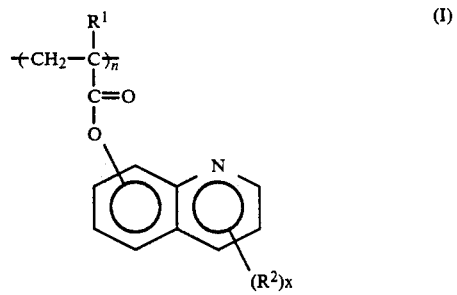

wherein $R^1$ is a hydrogen atom or an alkyl group having 1 to 4 carbon atoms, $R^2$ is a hydrogen atom, an alkyl or alkoxy group having 1 to 4 carbon atoms, an aryl group, an aryloxy group, a thioether group, an amino group, a halogen atom, an aldehyde group, a cyano group, a nitro group or a hydroxyl group, x is an integer of 1 to 6, on the condition that, if x is an integer of 2 to 6, $R^2$ may be the same or different, and n is an integer not less than 2.

15 Claims, 2 Drawing Sheets

ORGANIC THIN FILM ELECTROLUMINESCENT DEVICE

BACKGROUND OF THE INVENTION

This invention relates to an organic thin film electroluminescent device.

In keeping with the progress towards a more intelligent society, various display devices have been developed. Of these, electroluminescent devices, referred to hereinafter as EL devices, are attracting attention as ideal fully solid planar light emitting devices.

Heretofore, as an EL device, a device having a light emitting layer formed of ZnS:Mn, which is an inorganic light emitting agent, sandwiched between two electrodes, has been used extensively. Such an EL device, however, has a defect that, since its operation is based on a so-called impact excitation type light emitting mechanism, it needs a driving voltage in excess of 100 V (a.c. voltage) and is low in light emitting efficiency and luminance. On the other hand, since the number of available inorganic light emitting materials is limited, the number of the colors that can be displayed is limited raising difficulties in achieving a full-color display.

For this reason, there has recently been proposed a variety of injection type organic thin film EL devices operating under a light emitting mechanism different from that of the conventional EL devices. For example, there are proposed by C. W. Tang et al. an EL device in which, to produce for light emission of high luminance comparable to that of a light emitting diode under low d.c. voltage of the order of several tens volts, an arylamine compound is evaporated between a light emitting layer and a hole injection electrode, to form a layer that functions as an organic hole transport layer, and in which an electron injection electrode is formed of a metal, such as magnesium, having a low work function; an EL device in which a light emitting electron transport layer and a hole injection layer are sandwiched between two electrodes; and an EL device in which a dopant such as cumarine is doped in a light emitting electron transport layer and in which phosphorescent light emitted from the dopant is used as an emission light source (Appl. Phys. Lett. 51 (12), 913 (1987)). There is also proposed by Adachi et al. an EL device in which a hole transport layer, a light emitting layer and an electron transport layer are sandwiched between two electrodes (Jpn. Journal of Applied Physics, 27, No. 2 L 269 (1988)).

However, these EL devices have a disadvantage that, since a monomer is employed as a component constituting the electron transport layer and the hole transport layer, these layers need to be formed by evaporation or a like method, so that it is difficult to render the thicknesses of the layers constant and hence non-uniformities are produced in the luminance or colors of the devices. In addition, since pinholes or similar defects are likely to be produced so that shorting may occur in the device, render the device non-luminescent to adversely affecting neighboring devices. On the other hand, since the various layers are formed by evaporation, it is difficult to increase the area of the layers.

SUMMARY OF THE INVENTION

It is an object of the present invention to provide an organic thin film EL device which is free from pinholes or like defects and uniform in thicknesses of hole transport layers and electron transport layers, which has superior light emitting properties under low operating voltage.

It is another object of the present invention to provide an EL device which may be increased easily in area and which may be produced in large quantities.

The above and other objects of the present invention will become apparent from the following description.

In accordance with the present invention, there is provided an organic thin film electroluminescent device comprising an electron transport layer, a hole transport layer and a transparent electrode, the electron transport layer comprising, as an essential component, an electron conducting polymer represented by the formula (I)

wherein $R^1$ is a hydrogen atom or an alkyl group having 1 to 4 carbon atoms, $R^2$ is a hydrogen atom, an alkyl or alkoxy group having 1 to 4 carbon atoms, an aryl group, an aryloxy group, a thioether group, an amino group, a halogen atom, an aldehyde group, a cyano group, a nitro group or a hydroxyl group and x is an integer of 1 to 6, on the condition that, if x is an integer of 2 to 6, $R^2$ may be the same or diferent, and n is an integer not less than 2.

PREFERRED EMBODIMENTS OF THE INVENTION

The present invention will be explained in more detail.

The organic thin film EL device of the present invention is a two-layer device including a hole transport layer, an electron transport layer, a transparent electrode and a cathode or a three-layer device further including a light emitting layer, wherein the electron transport layer includes a specific electron conducting polymer as an essential component.

The specific electron conducting polymer contained as a component of the electron transport layer is represented by the formula (I)

wherein $R^1$ is a hydrogen atom or an alkyl group having 1 to 4 carbon atoms, $R^2$ is a hydrogen atom, an alkyl or alkoxy group having 1 to 4 carbon atoms, an aryl group, an aryloxy group, a thioether group, an amino group, a halogen atom, an aldehyde group, a cyano group, a nitro group or a hydroxyl group and x is an integer or 1 to 6, on the condition that, if x is an integer of 2 to 6, $R^2$ may be the same or different, and n is an integer not less than 2. If $R^1$ is an alkyl group having 5 or more carbon atoms, and/or $R^2$ is an alkyl group or an alkoxy group having 5 or more carbon atoms, preparation of the polymer is rendered difficult.

The monomers constituting the electron conducting polymer represented by the formula (I) preferably include, for example, 8-quinolyl methacrylate, 4-quinolyl methacrylate, 5-chloro-8-quinolyl methacrylate, 5,7-dibromo-8-quinolyl methacrylate, 5,7-dichloro-8-quinolyl methacrylate, 5-nitro-8-quinolyl methacrylate and 2-hydroxy-4-quinolyl methacrylate. The polymerization degree of the electron conducting polymer is such that n in the formula (I) is 2 or more, preferably 2 to 10000, more preferably 2 to 5000, and most preferably 5 to 1000. If n is in excess of 10000, solubility in a solvent is undesirably lowered. The number average molecular weight of the electron conducting polymer may preferably be 500 or more, more preferably 500 to 2000000 and most preferably 1000 to 1000000. For preparing the electron conducting polymer, a compound represented by the formula (II)

wherein $R^1$ is the same as $R^1$ in the formula (I) and x is a desorptive group, such as a hydroxy group or halogen atoms, e.g. fluorine, chlorine, bromine and iodine atoms, and a compound represented by the formula (III)

wherein $R^2$ and x are the same as $R^2$ and X in the formula (I) and Y is a desorptive group, such as a hydrogen atom or alkali metal atoms, e.g. lithium, sodium, potassium, rubidium and cesium atoms, are reacted together under agitation in a solvent, such as benzene, toluene or xylene, to produce a monomer constituting the electron conducting polymer. Although there is no limitation to the reaction temperature provided that it is within a range from the melting point to the boiling point of the solvent, it may preferably be in a range from 0° to 100° C. and more preferably in a range from 20° to 80° C. The molar charging ratio between the compound of the formula (II) and the compound of the formula (III) in carrying out the above reaction may preferably be 1:0.1 to 10 and more preferably 1:0.7 to 1.3. If the charging ratio to the compound of the formula (III) relative to the compound of the formula (II) is less than 0.1, reaction is inhibited, whereas, if the ratio is in excess of 10, purification is undesirably rendered difficult.

Although a by-product XY, where X and Y denote the desorptive groups of the formulas (II) and (III), respectively, is formed in the above reaction, such by-product may be removed by filtration if the by-product is a precipitate. Or if the by-product XY is dissolved as an acid, the by-product may be converted into a salt by addition of a base or an amino compound, such as trimethylamine, triethylamine, tributylamine or pyridine followed by precipitation and filtration. Alternatively, the by-product XY may be removed by using a dehydrating agent, such as a molecular sieve, if the by-product XY is water, for producing a feed monomer, that is, a monomer constituting an electron conducting polymer. The produced feed monomer may be dissolved in a solvent in the presence of a polymerization initiator and polymerized to produce the electron conducting polymer by conventional anionic polymerization or radical polymerization when the feed monomer does not contain active hydrogen or by conventional radical polymerization when the feed monomer contains active hydrogen. For polymerizing the feed monomer by anionic polymerization, alkali metals such as lithium, potassium or sodium, or organometallic compounds, such as LiR, NaR, AlR$_3$, ZnR$_2$ or MgR$_2$, wherein R is preferably an alkyl group having 1 to 24 and desirably 1 to 12 carbon atoms or a phenyl group, may be employed as the polymerization initiator. For polymerization by radical polymerization, radical polymerization initiators, such as benzoyl peroxide or azobisisobutyronitrile, abbreviated hereinafter to AIBN, may be employed. There is no specific limitation to the solvent for polymerization, provided that the solvent may dissolve the electron conducting polymer represented by the formula (I) and is not obstructive to the polymerization reaction. For example, aromatic hydrocarbons, cyclic ethers or amide compounds are preferably employed. More specifically, the solvents preferably include benzene, toluene, xylene, tetrahydrofuran and N,N-dimethylacetoamide.

There is no specific limitation to the polymerization temperature, provided that the temperature is in a range from the melting point to the boiling point of the solvent. Preferably, the polymerization temperature may be in a range from 20° to 70° C. If the electron conducting polymer produced by the above method is precipitated from the solvent, it may be purified by direct filtration and, if the polymer is dissolved in a solvent, it may be purified by precipitation into a poor solvent, such as alcohols, e.g. methanol, ethanol or propanol, or aliphatic hydrocarbons, such as pentane, hexane or heptane, followed by filtration.

According to the present invention, the electron transport layer having the electron conducting polymer is a layer capable of efficiently transporting electrons only. In the case of the three-layer organic thin film EL device, it suffices if the layer includes the aforementioned electron conducting polymer. However, in the case of the two-layer organic thin film EL device in which the light emitting layer is not formed as described subsequently, it is necessary that an organic light emitting agent be contained in the layer in addition to the electron conducting polymer.

The organic light emitting agents preferably include cumarine derivatives, such as 7-dimethylamino-4-methylcumarine, 4,6-dimethyl-7-ethylaminocumarine, 3-(2'-benzothiazole)-7-dimethylaminocumarine or 7-amino-3-phenylcumarine, dicyanomethylenepyran and dicyanomethylenethiopyran derivatives, such as 4-(dicyanomethylene)-2-methyl-6-(p-dimethyl-aminostyryl)-4H-pyran or, 4-(dicyanomethylene)-2-methyl-6-[2-(9-durolysyl)ethenyl]-4H-pyran, 1,4-bis(alkylstyryl) benzene derivatives, such as 1,4-bis(2-methylstyryl) benzene, distyryl benzene or 1,4-bis(3-ethylstyryl) benzene, and chelated oxynoid compounds, such as bis[benzo(f)-8-quinolinol] zinc and bis(2-methyl-8-quinolilate) aluminum oxide. These may be used either alone or in combination. Although there is no specific limitation to the amount of addition of the organic light emitting agent to the electron transport layer, it may preferably be not more than the dispersion saturation point at ambient temperature. Specifically, it may preferably be in a range of 0.1 to 60 wt. % and more preferably in a range of 1 to 50 wt. % based on the total weight of the electron transport layer. If the amount of addition is less than 0.1 wt. %, luminance is undesirably lowered, whereas, if it exceeds 60 wt. %, dispersibility of the organic light emitting agent is similarly undesirably lowered.

According to the present invention, the electron transport layer may be formed by dissolving the electron conducting polymer or a dispersion of the organic light emitting agent in the above mentioned electron conducting polymer in an organic solvent and applying the resulting solution on a hole transport layer as later described for the two-layer organic thin film EL device, or on a light emitting layer as later described for the three-layer organic thin film EL device, by employing the spin coating method, the casting method or the dipping method. The organic solvents may preferably include, for example, benzene, toluene, xylene, tetrahydrofuran and N,N-dimethylacetoamide. The coating solution containing the electron conducting polymer may contain additives which will not prove to be a trapping agent for holes or electrons. Coating is preferably so performed that the film thickness of the electron transport layer may preferably be in an range of 100 to 3000 Å and more preferably in a range of 500 to 1500 Å. If the film thickness is 100 Å or less, there may be lowered luminance and pinhole production, whereas, if the film thickness is in excess of 3000 Å, the operating voltage may undesirably be increased due to the increased resistance of the device.

According to the present invention, the above mentioned light emitting layer employed in the three-layer organic thin film EL device is formed by vacuum deposition of the above mentioned organic light emitting agent in, for example, a monomer state, on the hole transport layer, which will be described subsequently. The film thickness of the light emitting layer may preferably be 50 to 3000 Å and more preferably 200 to 1000 Å.

According to the present invention, the hole transport layer is mainly composed of a hole transport material which will exclusively transport only holes with high efficiency on application of electrical voltage. Although there is no specific limitation to the hole transport material provided that it exhibits hole transporting properties, a polymer having the following formula (IV)

is most preferred, wherein $R^3$, $R^4$, $R^5$, $R^6$ and $R^7$ are the same or different and each stand for a hydrogen atom or a hydrocarbon residue having 1 to 20 carbon atoms, $Ar^1$ and $Ar^2$ are the same or different and each stand for a bivalent aromatic hydrocarbon residue, and k, l, m stand for integers not less than 0, not less than 1 and not less than 2, respectively. More specifically, $R^3$, $R^4$ and $R^5$ in the polymer represented by the formula (IV) may preferably be hydrocarbon residues such as alkyl, aryl and aralkyl groups or derivatives thereof having 1 to 20 carbon atoms, or hydrogen atoms, whereas $R^6$ and $R^7$ may preferably be hydrocarbon residues having 1 to 20 carbon atoms, such as alkyl, aryl and aralkyl groups or derivatives thereof, furyl, pyridyl groups, and hydrogen atoms. $Ar^1$ may preferably be a bivalent aromatic hydrocarbon residue, such as a phenylene group or derivatives thereof, such as a methylphenylene group, whereas $Ar^2$ may preferably be a bivalent aromatic hydrocarbon residue, such as various phenylene groups, and biphenylene groups or derivatives thereof, bivalent monocyclic or polycyclic aromatic hydrocarbon residues, or bivalent hetero atom containing heterocyclic aromatic hydrocarbon residues. In the above formula (IV), k may be an integer of from 0 to 50, preferably 0 to 10, l may be an integer of from 1 to 50, preferably 1 to 30 and m may be an integer of from 2 to 1000 and preferably 5 to 500. The polymer having the formula (IV) exhibits a high hole transport capacity because it has high mechanical strength and is not in need of a matrix polymer. More specifically, polymers represented by the following formulas are most preferred.

where y is an integer not less than 2;

wherein z is an integer not less than 2;

where a is an integer not less than 2; and where b is an integer not less than 2.

For preparing the above mentioned hole transport polymer, a compound represented by the formula (V)

wherein $R^3$, $R^4$, $R^5$, $Ar^1$, $Ar^2$, k and l have the same meanings as those of the formula (IV) such as, for example, an N,N'-diphenyl-p-phenylene diamine compound or an N-phenyl-N'-(4-phenylamino)phenyl-p-phenylenediamine compound, and one of a variety of carbonyl compounds, such as aldehydes, aldehyde polymers or ketones, are subjected to polycondensation reaction in one of a variety of organic solvents, such as ethers, e.g. ethylether or tetrahydrofuran, halogenated hydrocarbons, such as chloroform, or nitrocompounds, such as nitrobenzene, acetonitrile or propylene carbonate, at a temperature preferably of 0° to 200° C. for a reaction time preferably of 1 minute to 500 hours and more preferably of 5 minutes to 200 hours, using an acid or an alkali as a catalyst. The above mentioned hole transport layer may be formed by dissolving the hole transport material in an organic solvent, such as chloroform, benzene, tetrahydrofuran (THF), $CH_2Cl_2$, N-methylpyrrolidone or nitrobenzene and coating the resulting solution on a transparent electrode, as later described, by using the spin coating method, the casting method or the dipping method. Of these, the spin coating method is most preferred for forming a submicron order uniform thin film free of pinholes or the like defects. For achieving efficient hole transport, the film thickness of the hole transport layer is preferably 100 to 3000 Å and more preferably 500 to 1500 Å.

According to the present invention, the transparent electrode and the cathode are the electrodes for an organic thin film EL device. The transparent electrode may be formed by providing a transparent electrically conductive layer on a transparent substrate, such as a glass sheet or a film of a transparent synthetic resin, e.g. a polyester film. The transparent electrically conductive layer may be formed on the transparent substrate by depositing a metal, such as gold or platinum, or a metal oxide, such as tin oxide or indium oxide, preferably by sputtering, vacuum deposition or the like thin film forming method. The material constituting the above mentioned cathode include metals with a lower work function, such as aluminum, indium, magnesium, tungsten, titanium or molybdenum, and may be deposited on the electron transport layer preferably by vacuum deposition or the like method.

A preferred method for producing an organic thin film EL device according to the present invention is explained by referring to the drawings.

Figure 1:
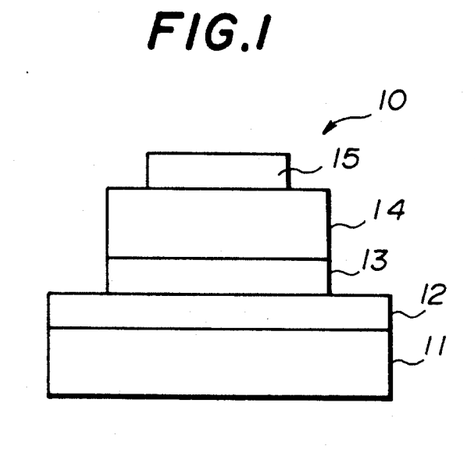
FIG. 1 is a schematic view showing a two-layer type organic thin film EL device.

Referring to FIG. 1 schematically showing a two-layer organic thin film EL device 10, a hole transport material dissolved in a solvent is applied on a transparent substrate 11, on the upper surface of which a transparent electrically conductive layer 12 is formed previously. The solvent is then volatilized off to produce a hole transport layer 13. A material containing an electron conducting polymer is dissolved in a solvent in which the material containing the electron conducting polymer is soluble but in which the hole transport material is not soluble, and a light emitting agent is dispersed in the resulting solution. The resulting dispersion is coated on the hole transport layer 13 and the solvent is volatilized off to produce a light emitting electron transport layer 14. A material constituting a cathode is then bonded on the layer 14, such as by vacuum deposition, to produce a cathode 15.

Figure 2:
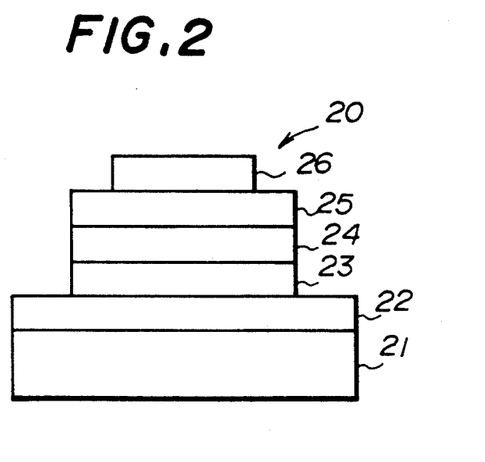
FIG. 2 is a schematic view showing a three-layer type organic thin film EL device.

FIG. 2 shows schematically a three-layer type organic thin film EL device 20. For producing the device 20, a hole transport layer 23 is formed on a transparent substrate 21 provided with a transparent electrically conductive layer 22, similarly to the two-layer type device 10. A light emitting agent is deposited, such as by vacuum deposition, on the hole transport layer 23, to produce a light emitting layer 24. A material containing an electron conducting polymer is dissolved in a solvent in which the material containing the electron conducting polymer is soluble and in which the light emitting agent is not soluble, and the resulting solution is applied to the light emitting layer 24. The solvent is then volatilized off to produce an electron transport layer 25, on which a cathode 26 is then formed to complete the EL device 20, as in the case of producing the two-layer device 10.

The organic thin film EL device of the present invention, making use of a specific electron conducting polymer as a material for an electron transport layer, has a high operational reliability, since it is superior in light emitting properties at low operating voltage and uniform in film thickness, while being free from pinholes or like defects. The EL device of the present invention, making use of the above mentioned polymer, may be produced in large quantities by the spin coating method or the like, so that a larger surface area of the device may be achieved easily, while mass production can also be realized.

EXAMPLES OF THE INVENTION

The present invention will be explained in more detail by referring to Examples, which are given only for illustration and are not intended for limiting the scope of the invention.

EXAMPLE 1

Figure 3:
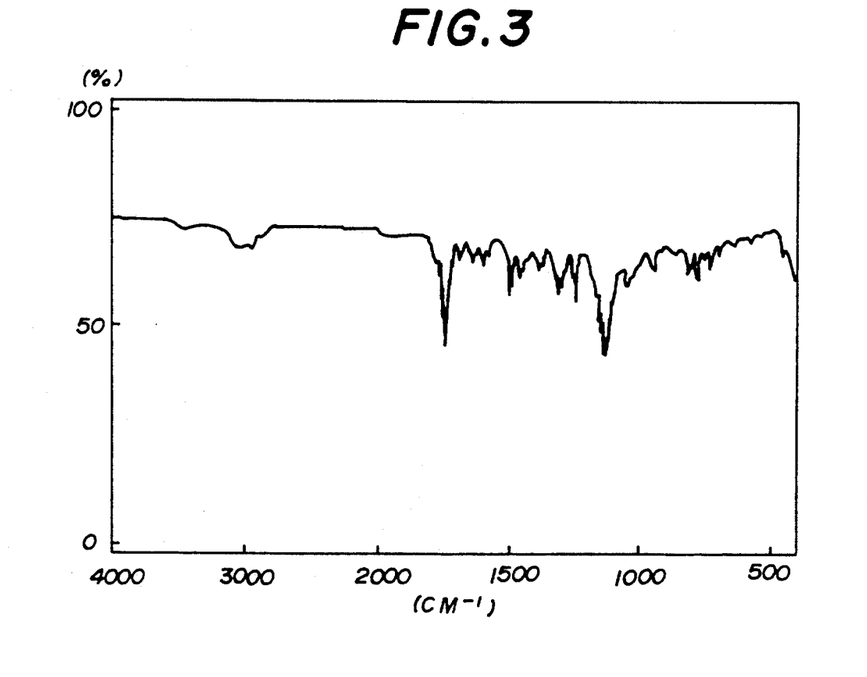
FIG. 3 is a chart showing an IR spectrum of 8QMA produced in Example 1.

20 ml of a toluene solution containing 8.1 ml of chloride methacrylate were added dropwise to 50 ml of a toluene solution containing 10 g of 8-quinolinol and 28 g of pyridine as a catalyst. After termination of the dropwise addition, reaction was carried out for 3 hours and 40 minutes at a temperature of 60° C. to produce white-tinted precipitates, which were then filtered under nitrogen. A filtrate thus produced was washed with saturated saline and dried overnight over $Na_2SO_4$. After drying, the solvent was removed by an evaporator and the resulting crystals were purified by recrystallization in methanol to give 7.2 g of white-tinted crystals. The yield was 49%. The white crystals were identified as 8-quinolyl methacrylate, abbreviated to 8 QMA, by measurement of its IR spectrum. FIG. 3 shows the IR spectrum.

Figure 4:
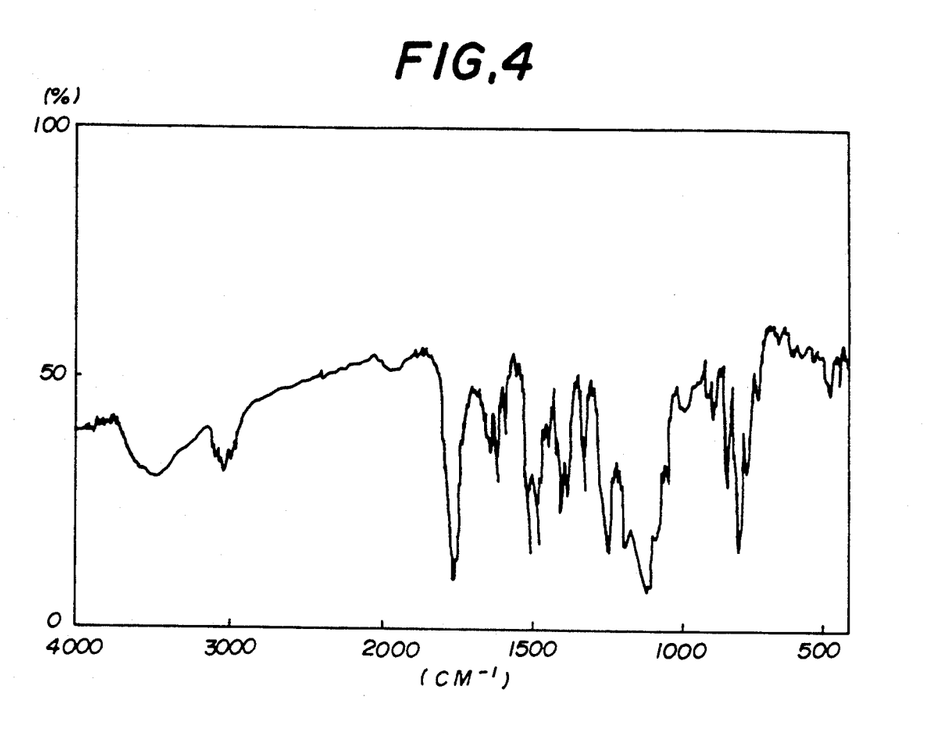
FIG. 4 is a chart showing an IR spectrum of P8QMA produced in Example 1.

2.7 g of 8 QMA and 33 mg of azobisisobutyronitrile as a polymerization initiator were dissolved in 3 ml of N,N-dimethylacetoamide and polymerized at 60° C. for 2.5 hours under a nitrogen atomosphere. After completion of polymerization, the resulting liquid polymerization product was again added dropwise into methanol for re-precipitation. Thus, 2.46 g of poly 8-quinolyl methacrylate, abbreviated to P8QMA, were produced. The number average molecular weight and yield of P8QMA were 88000 and 91%, respectively. FIG. 4 shows an IR spectrum of the produced P8QMA.

Figure 5:
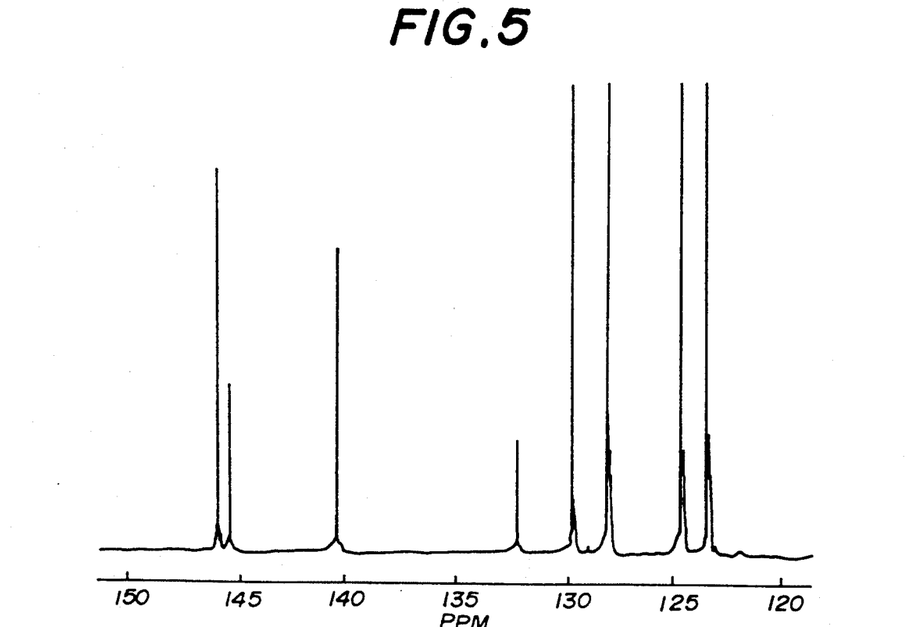
FIG. 5 is a chart showing $^{13}$C-NMR spectrum of an N-tolyldiphenylamine-paraaldehyde condensation polymerization product.

Then, 2.5 g of N-tolyldiphenylamine were charged into a three-necked flask with a 100 ml capacity, having its atmosphere replaced by nitrogen, and 20 mg of were added for dissolution. Then, 40 mg of p-toluenesulfonic acid and 0.6 ml of para-aldehyde were added and the reaction was carried out at 80° C. for four hours. The resulting reaction solution was charged into 300 ml of ethanol and gray to white precipitates were filtered off and washed with ethanol and distilled water. The precipitates were reprecipitated in a chloroform-ethanol mixed solution, purified and dried to produce 2.6 g of white-tinted powders. Measurement by gel permeation chromatography revealed that the powders were a high molecular weight product with a peak top molecular weight of the eluation curve of approximately 9000 (polymerization degree, about 31). Measurement by $^1H$-NMR, $^{13}C$-NMR and IR revealed that the powders were an N-tolyldiphenylamine-para-aldehyde condensation polymerization product having the following structure. FIG. 5 shows a $^{13}C$-NMR chart.

A 5 cm×5 cm ITO glass piece (manufactured by Matsuzaki Shinku KK; planar resistance, 10 ohm/□) as a transparent electrode was ultrasonically washed in toluene and a mixed solution of equal weight parts of isopropyl alcohol and water.

Then, 50 mg of the above mentioned N-tolyldiphenylamine-para-aldehyde condensation polymerization product were dissolved in 5 ml of a mixed chloroform-toluene solvent (weight ratio, 80:20) and the resulting solution was applied on the ITO glass piece by the spin coating method. The film thickness at this time was approximately 950 Å.

Then, 500 mg of P8QMA and 230 mg of 1,4-bis(2-methylstyryl) benzene as a light emitting agent were dissolved in 10 ml of an N,N-dimethylacetoamide-toluene solvent mixture (weight ratio, 80:10). After insoluble crystals were filtered off, the solution was spin-coated on the previously applied N-tolyldiphenylamine-para-aldehyde condensation polymerization product film to produce an electron transport layer containing the organic light emitting agent. The film thickness of the P8QMA layer at this time was approximately 400 Å. Aluminum was finally deposited to form a cathode having a thickness of approximately 3000 Å and an area of approximately 0.25 $cm^2$ to complete an organic thin film EL device. A d.c. increasing voltage was applied to the produced EL device. It was found that the surface of the device in its entirety emitted blue to white color from the voltage of 6 V on.

EXAMPLE 2

20 ml of a toluene solution containing 8.1 ml of chloride methacrylate were added dropwise to 50 ml of a toluene solution containing 10 g of 4-quinolinol and 28 g of pyridine. After termination of the dropwise addition, the reaction was carried out at 60° C. for 3 hours and 45 minutes and the produced white-tinted precipitates were filtered under nitrogen. The produced filtrate was washed with saturated saline and dried overnight over $Na_2SO_4$. The solvent was removed by an evaporator and the residual crystals were purified by recrystallization in methanol to produce 7.2 g of white-tinted crystals. The yield was 41%. As a result of measurement of an IR spectrum, the produced white-tinted crystals could be identified as 4-quinolyl methacrylate, abbreviated to 4QMA.

2.7 g of 4QMA and, as a polymerization initiator, 33 mg of azobisisobutyronitrile, were dissolved in 3 ml of N,N-dimethylacetoamide, and polymerization was carried out at 60° C. for 2.5 hours under a nitrogen atmosphere. After termination of polymerization, the produced polymerization liquid was added dropwise to methanol for reprecipitation. Thus, 2.46 g of poly 4-quinolyl methacrylate, abbreviated to P4QMA, were produced. The number average molecular weight and the yield of the produced P4QMA were 92000 and 90%, respectively.

An organic thin film EL device was produced in the same way as in Example 1, except using the above P4QMA in place of P8QMA. An increasing d.c. voltage was applied to the produced device. It was found that, from the impressed voltage of 10 V on, the surface of the device in its entirety emitted blue to white light.

EXAMPLE 3

A 5 cm×5 cm ITO glass piece (manufactured by Matsuzaki Shinku KK; planar resistance, 10 ohm/□), was ultrasonically washed in toluene and in a mixed solution containing equal weight parts of isopropyl alcohol and water.

50 mg of the N-tolyldiphenylamine-para-aldhyde condensation polymerization product, obtained in Example 1, were dissolved in 5 ml of a mixed solvent containing chloroform and toluene at a weight ratio of 80:20, and the resulting solution was spin coated on the ITO glass piece to a thickness of approximately 920 Å.

As a light emitting layer, 1,2,3,4,5-pentaphenyl cyclopentadiene was applied by vacuum deposition. The thickness of the deposited film was 1000 Å.

500 mg of PQ8MA, obtained in Example 1, were dissolved in 10 ml pf N,N-dimethylacetoamide and spin coated on the light emitting layer. The film thickness of PQ8MA was 400 Å.

Aluminum was finally vacuum deposited to a film thickness of 3000 Å. The area of the aluminum film was 0.25 cm².

An increasing d.c. voltage was applied to the produced organic thin film EL device, using the ITO glass piece as an anode and the aluminum film as a cathode. It was seen that the surface of the device in its entirety emitted blue light from the impressed voltage of 14 V on.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. An organic thin film electroluminescent device comprising an electron transport layer, a hole transport layer and a transparent electrode, said electron transport layer comprising an electron conducting polymer represented by the formula (I)

wherein $R^1$ is a hydrogen atom or an alkyl group having 1 to 4 carbon atoms, x is an integer from 1 to 6, each $R^2$ is independently selected from the group consisting of a hydrogen atom, an alkyl group having 1 to 4 carbon atoms, an alkoxy group having 1 to 4 carbon atoms, an aryl group, an aryloxy group, a thioether group, an amino group, a halogen atom, an aldehyde group, a cyano group, a nitro group or a hydroxyl group, and n is an integer not less than 2.

2. The device according to claim 1 wherein a monomer constituting the electron conducting polymer represented by the formula (I) is derived from a monomer selected from the group consisting of 8-quinolyl methacrylate, 4-quinolyl methacrylate, 5-chloro-8-quinolyl methacrylate, 5,7-dibromo-8-quinolyl methacrylate, 5,7-dichloro-8-quinolyl methacrylate, 5-nitro-8-quinolyl methacrylate, 2-hydroxy-4-quinolyl methacrylate, and mixtures thereof.

3. The device according to claim 1 wherein said electron conducting polymer has a number average molecular weight of not less than 500.

4. The device according to claim 1 wherein said electron transport layer further includes light emitting means comprising an organic light-emitting agent.

5. The device according to claim 4 wherein said organic light emitting agent is selected from the group consisting of 7-dimethylamino-4-methylcumarine, 4,6-dimethyl-7-ethylaminocumarine, 3-(2'-benzothiazole)-7-dimethylaminocumarine, 7-amino-3-phenylcumarine, 4-(dicyanomethylene)-2-methyl-6-(p-dimethyl-aminostyryl)-4H-pyran, 4-(dicyanomethylene)-2-methyl-6-[2-(9-durolysyl) ethenyl]-4H-pyran, 1,4-bis(2-methylstyryl) benzene, distyryl benzene, 1,4-bis(3-ethylstyryl) benzene, bis[benzo(f)-8-quinolinol]zinc, bis(2-methyl-8-quinolilate) aluminum oxide, and mixtures thereof.

6. The device according to claim 4 wherein a proportion of said organic light emitting agent added is 0.1 to 60 wt. % based on the total weight of said electron transport layer.

7. The device according to claim 1 wherein said electron transport layer has a film thickness of 100 to 3000 Å.

8. The device according to claim 1 further comprising a light emitting layer.

9. The device according to claim 8 wherein said light emitting layer includes a light emitting agent selected from the group consisting of 7-dimethylamino-4-methylcumarine, 4,6-dimethyl-7-ethylaminocumarine, 3-(2'-benzothiazole)-7-dimethylaminocumarine, 7-amino-3-phenylcumarine, 4-(dicyanomethylene)-2-methyl-6-(p-dimethyl-aminostyryl)-4H-pyran, 4-(dicyanomethylene)-2-methyl-6-[2-(9-durolysyl) ethenyl]-4H-pyran, 1,4-bis(2-methylstyryl) benzene, distyryl benzene, 1,4-bis(3-ethylstyryl) benzene, bis[benzo(f)-8-quinolinol]zinc, bis(2-methyl-8-quinolilate) aluminum oxide, and mixtures thereof.

10. The device according to claim 1 wherein said hole transport layer includes a hole transport material represented by the formula (IV)

wherein $R^3$, $R^4$, $R^5$, $R^6$ and $R^7$ are the same or different and each stand for a hydrogen atom or a hydrocarbon residue having 1 to 20 carbon atoms, $Ar^1$ and $Ar^2$ independently stand for a bivalent aromatic hydrocarbon residue, k is an integer not less than 0, 1 is an integer not less than 1 and m is an integer not less than 2.

11. The device according to claim 10 wherein said hydrocarbon residue having 1 to 20 carbon atoms represented by $R^3$, $R^4$ and $R^5$ is selected from the group consisting of an alkyl group, an aryl group, an aralkyl group, and derivatives thereof and wherein said hydrocarbon residue having 1 to 20 carbon atoms represented by $R^6$ and $R^7$ is selected from the group consisting of an alkyl group, an aryl group, an aralkyl group, derivatives of alkyl, aryl and aralkyl groups, furyl group and pyridyl group.

12. The device according to claim 10 wherein $Ar^1$ and $Ar^2$ are selected from the group consisting of phenylene and biphenylene groups and derivatives thereof.

13. The device according to claim 10 wherein said hole transport material is selected from the group consisting of wherein y is an integer not less than 2.

wherein z is an integer not less than 2.

wherein a is an integer not less than 2, wherein b is an integer not less than 2, and mixtures thereof.

14. The device according to claim 1 wherein a film thickness of said hole transport layer is 100 to 3000 Å.

15. The device according to claim 1 wherein said transparent electrode is constituted by a transparent electrically conductive layer provided on a transparent substrate, said transparent electrically conductive layer being selected from the group consisting of gold, platinum, tin oxide, indium oxide and mixtures thereof.

* * * * *

UNITED STATES PATENT AND TRADEMARK OFFICE
CERTIFICATE OF CORRECTION

PATENT NO. : 5,231,329

DATED : July 27, 1993

INVENTOR(S) : Yoshinori Nishikitani, Naoki Kataoka, Nobuyuki Kuroda & Kazuo Matsuura It is certified that error appears in the above-identified patent and that said Letters Patent is hereby corrected as shown below:

```
Column 13, line 17, change "2." to -- 2, --
Column 13, line 30, change "2." to -- 2, --
```

Signed and Sealed this

Fifth Day of April, 1994

Attest:

BRUCE LEHMAN

Attesting Officer

Commissioner of Patents and Trademarks